United States Patent [19]

Ellul et al.

[11] Patent Number: 4,996,081
[45] Date of Patent: Feb. 26, 1991

[54] METHOD OF FORMING MULTIPLE NITRIDE COATING ON SILICON

[76] Inventors: Joseph P. Ellul, 27 Burnbrook Crescent, Nepean, Ontario, Canada, K2H 9A6; Sing P. Tay, 12 Vanessa Terrace, Nepean, Ontario, Canada, K2J 2J8

[21] Appl. No.: 848,609

[22] Filed: Apr. 7, 1986

Related U.S. Application Data

[63] Continuation of Ser. No. 693,490, Jan. 22, 1985, abandoned.

[51] Int. Cl.$^5$ .......................... B05D 5/12; C23C 16/30
[52] U.S. Cl. .......................................... 427/96; 427/99; 427/255; 427/255.4; 427/255.7; 427/402; 437/241; 437/242
[58] Field of Search ...................... 427/93, 94, 95, 96, 427/99, 248.1, 255, 255.4, 255.7, 344, 402

[56] References Cited

U.S. PATENT DOCUMENTS

| | | | |
|---|---|---|---|
| 3,421,936 | 1/1969 | Vogel | 427/255.4 |
| 4,001,465 | 1/1977 | Graul et al. | 427/93 |
| 4,230,745 | 10/1980 | Betz et al. | 427/344 |
| 4,266,985 | 5/1981 | Ito et al. | 427/255.4 |
| 4,282,270 | 8/1981 | Nozaki et al. | 427/255.4 |
| 4,331,710 | 5/1982 | Nozaki et al. | 427/94 |
| 4,435,447 | 3/1984 | Ito et al. | 427/255.4 |
| 4,438,157 | 3/1984 | Romano-Moran | 427/94 |
| 4,522,886 | 6/1985 | Chin et al. | 427/94 |

OTHER PUBLICATIONS

Lai, "Very Thin Gate Insulators", "Semiconductor Silicon 1981", Electrochemical Society, 416 (1981), pp. 416–426.
Heimann et al, "Electrical Conduction and Breakdown in Oxides of Polycrystalline Silicon and Their Correlation With Interface Texture", "Journal of Applied Physics", vol. 53, 6240 (1982), pp. 6240–6245.
Nemetz et al., "Thermal Nitridation of Silicon and Silicon Dioxide for Thin Gate Insulators", Solid State Technology, vol. 26, 79 (1983), pp. 79–85.
Murarka et al, "Thermal Nitridation of Silicon in Ammonia Gas: Composition and Oxidation Resistance of the Resulting Films", "Journal of Electrochemical Society", vol. 126, 996 (1979) pp. 996–1003.
Ito et al, "Advantages of Thermal Nitride and Nitroxide Gate Films in VLSI Process", "IEEE Transactions on Electron Devices", vol. 29, 498 (1982) pp. 498–502.
Wu et al, "Growth Kinetics of Silicon Thermal Nitridation", "Journal of Electrochemical Society", vol. 129, 1559 (1982) pp. 1559–1563.

Primary Examiner—Sadie Childs

[57] ABSTRACT

In an integrated circuit process a composite dielectric layer is formed on a monocrystalline, polycrystalline or amorphous silicon substrate by thermally growing a first silicon nitride layer from a surface layer of the silicon and then depositing a layer of amorphous or polycrystalline silicon. A second nitride layer is thermally grown from the deposited silicon to form a nitride-silicon-nitride, termed nitsinitride, composite dielectric. At least a top layer of the nitsinitride dielectric can be oxidized to produce an alternative composite dielectric, termed oxidized nitsinitride. Variation of the thickness of the dielectric layers and/or repeating the layering process sequence results in composite dielectrics of different thicknesses and dielectric properties.

15 Claims, 1 Drawing Sheet

METHOD OF FORMING MULTIPLE NITRIDE COATING ON SILICON

This is a Continuation of Application Ser. No. 693,490, filed Jan. 22, 1985 now abandoned.

BACKGROUND OF THE INVENTION

This invention relates to a method for forming composite dielectrics particularly for use in silicon integrated circuit processes and to integrated circuits incorporating such dielectric layers.

Development of micron and submicron technology for VLSI circuits is marked by a rapid increase in development of improved techniques for the formation of very thin (less than 20 nanometers) dielectrics. Thermally grown silicon dioxide is currently the most well known and commonly used dielectric. However, very thin silicon dioxide layers suffer from such problems as high defect density, high probability of low-field breakdown, poor masking qualities against dopant diffusion, and anneal-dependent dielectric constant. The shortcomings of silicon dioxide are detailed by Lai in"Semiconductor Silicon 1981", Electrochemical Society, 416 (1981). These problems are greatly magnified when thin silicon dioxide"interpoly" layers are utilized as the dielectric medium between layers of polysilicon used in certain types of VLSI chip, Heimann et al, Journal of Applied Physics, Volume 53, 6240 (1982).

A thermally grown silicon nitride layer appears to be a suitable candidate for eliminating some of the above-mentioned problems, Nemetz et al, Solid State Technology, Volume 26, 79 (1983), and various techniques for thermal nitride formation, mainly in an ammonia ambient, are known, Murarka, Journal of Electrochemical Society, Volume 126, 996 (1979) and Ito et al, IEEE Transactions on Electron Devices, Volume 29, 498 (1982). For current VLSI technology, nitride dielectric layers for device gates and between layers of polysilicon are required to be of the order of 7 to 10 nanometers thick. However, a single dry nitrogen nitridation at 1000 degrees centigrade is self-limiting to less than 5 nanometers, Wu et al, Journal of Electrochemical Society, Volume 129, 1559 (1982).

SUMMARY OF THE INVENTION

The present invention relates to the formation and use of two composite dielectrics, termed nitsinitride and oxidized nitsinitride, grown on a silicon substrate or on polycrystalline or amorphous silicon regions exposed at the surface of a partially Processed substrate. Substrates include monocrystalline silicon wafers, epitaxial silicon on monocrystalline silicon wafers, silicon-on-insulator, silicon-coated materials such as silicon-coated steel, silicon ribbon and other like substrates in which silicon is exposed where dielectric is to be formed.

A method of forming the composite dielectric, termed nitsinitride, comprises growing a first nitride layer on silicon, depositing a silicon layer on the nitride and thermally growing a second nitride layer on the deposited silicon. In one of the applications of the method, the substrate silicon is monocrystalline silicon and the deposited silicon can be polycrystalline or amorphous silicon. The nitride layers are each grown to a thickness of about 4 nanometers and the nitsinitride composite layer has a thickness of about 8 nanometers. The nitride can in each case be thermally grown on the underlying silicon in a nitrogen atmosphere at a temperature of the order of 1000 degrees centigrade and a pressure of the order of 10 atmospheres.

An alternative dielectric, termed oxidized nitsinitride, is formed by oxidizing at least the top nitride layer of a nitsinitride dielectric layer to produce an oxynitride layer. In one of the applications of the method, oxidation can take place in an atmosphere of 98 percent oxygen and 2 percent HCl at a temperature of 1000·degrees centigrade for a time of the order of 5 minutes. Essentially, in such an oxidation step, the whole or part of the upper nitride layer is converted to oxynitride and further oxidation can convert the whole or part of the underlying deposited silicon to silicon dioxide. Continued oxidation may convert any or all of the lower nitride into an oxynitride layer and, finally, oxidation may extend into the substrate silicon.

During growth of the top nitride layer of a nitsinitride structure, a part of the underlying deposited silicon is consumed. Consequently, the initially deposited silicon can be deposited to such a thickness, for example of the order of 3.5 nanometers, as to provide sufficient silicon to react with the nitrogen in forming the nitride. Indeed the thickness of the deposited silicon can be carefully chosen such that the nitsinitride layer becomes in fact an essentially uniform homogeneous layer of the order of 8 nanometers of silicon nitride. Amorphous silicon can be low pressure chemically vapor deposited at a temperature less than 550 degrees centigrade. As an alternative to forming the first nitride on the monocrystalline silicon, the nitride can be thermally grown on a layer of polycrystalline or amorphous silicon deposited onto a previously prepared substrate.

BRIEF DESCRIPTION OF THE DRAWINGS

Embodiments of the invention will now be described by way of example with reference to the accompanying drawings in which.

DETAILED DESCRIPTION OF THE PREFERRED EMBODIMENTS

Figure 1:
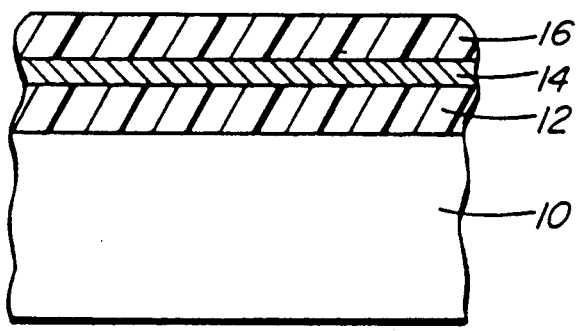
FIG. 1 is a non-scalar cross-sectional view of part of a wafer incorporating a nitsinitride dielectric layer according to the invention.

Referring to FIG. 1 in detail, there is shown a sectional view through a wafer having a monocrystalline silicon substrate 10, a layer 12 of silicon nitride grown on the substrate, a layer 14 of amorphous silicon above the silicon nitride layer 12, and a second silicon nitride layer 16 grown on the amorphous silicon layer 14.

In one such example, the starting substrate 10 is a 100 orientation, 4 to 6 ohm cm, n-type, CZ, 100 millimeter diameter silicon wafer. After substrate cleaning, a silicon nitride layer 12 of 3 to 4 nanometers thickness is thermally grown at about 1000 degrees centigrade in a dry nitrogen ambient at about 10 atmospheres pressure. A thin layer 14 of undoped amorphous silicon approximately 3.5 nanometers in thickness is then deposited on the wafer. The second silicon nitride layer 16 is then thermally grown. During growth, part at least of the amorphous silicon is consumed. The total nitride-silicon-nitride sandwich layer produced, termed nitsinitride, is of the order of 8 nanometers thick, of which the nitride occupies about 7 nanometers.

The nitsinitride composite dielectric exhibits good dielectric characteristics with breakdown voltages in the 9 to 10 volt range and current densities in the order of $10^{-3}$ A/cm$^2$ before structural dielectric breakdown. The corresponding breakdown field strength is about 11 MV/cm.

Figure 2:
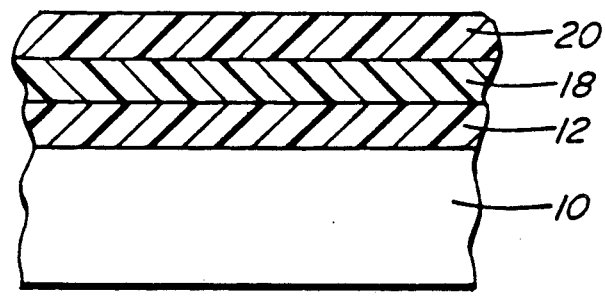
FIG. 2 is a non-scalar cross-sectional view of part of the FIG. 1 wafer following oxidation.

In an alternative embodiment, shown in FIG. 2, the nitsinitride composite structure previously described is oxidized for example in a 2 percent HCl:98 percent dry oxygen ambient at 1000 degrees centigrade for 5 minutes. This forms an alternative composite dielectric structure, termed oxidized nitsinitride.

Referring to FIG. 2 in detail, there is shown a sectional view through a wafer having a monocrystalline silicon substrate 10, a layer 12 of silicon nitride grown on the substrate, a layer 18 of silicon dioxide above the silicon nitride layer 12, and a silicon oxynitride layer 20 on the silicon dioxide layer 18.

The structure is achieved by oxidizing the FIG. 1 structure for a sufficient time that the nitride layer 16 and the silicon layer 14 are oxidized respectively to the oxynitride layer 20 and the silicon dioxide layer 18. The first nitride layer 12 and substrate 10 remain unchanged. Optionally oxidation can be sustained to convert the lower nitride layer into oxynitride and the substrate top layer into silicon dioxide.

Figure 3:
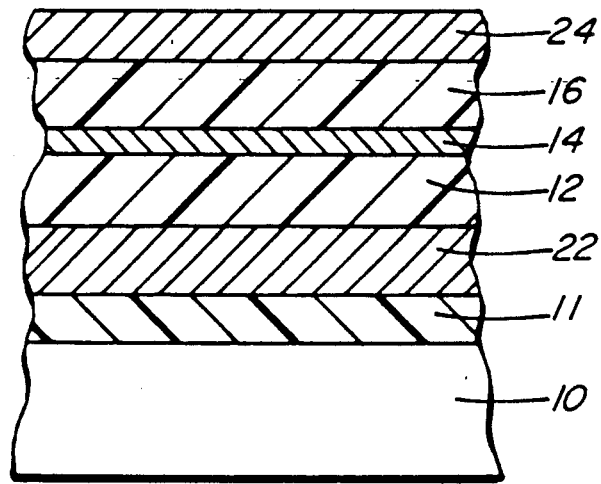
FIG. 3 is a non-scalar cross-sectional view of a wafer incorporating a nitsinitride dielectric layer in an alternative arrangement.

In an alternative embodiment (FIG. 3), particularly adapted for a device having interleaved layers of dielectric and polysilicon, a first level of doped polysilicon 22 is formed on the surface of thermal oxide 11 grown on a silicon substrate 10. A first layer of nitride 12 is grown as some of the first layer polysilicon 22 is consumed. A further layer of amorphous silicon 14 is deposited on the nitride 12 and a second layer of nitride 16 is grown so as to consume some or all of the amorphous silicon layer 14. A second doped polysilicon layer 24 is formed on top of the second layer of nitride 16. The resulting structure is a polysilicon-nitsinitride-polysilicon structure.

The breakdown and conduction characteristics of the nitsinitride composite dielectric formed on polysilicon are similar to those of nitsinitride dielectric formed on single crystal silicon.

Similarly, in another alternative embodiment (not shown), oxidized nitsinitride dielectric may be formed on deposited polysilicon to form a polysilicon-oxidized nitsinitride-polysilicon structure. The breakdown and conduction of the oxidized nitsinitride composite dielectric thus formed on polysilicon show markedly improved characteristics over interpoly oxides of comparable thickness.

It will be seen that the deposited silicon layer, if of the correct thickness, can be totally consumed on formation of the second layer of silicon nitride. In this case the resultant dielectric layer is substantially uniform silicon nitride throughout and does not have the characteristic sandwich appearance shown in the Figures.

Choice of a sandwich structure or of a uniform nitride structure is dictated by the particular utilization.

It will also be appreciated that the sequences can be repeated to grow dielectric layers which are thicker than 10 nanometers and of various composite layers.

Nitsinitride and oxidized nitsinitride composite dielectric layers, can be used for gate and interpoly dielectrics and since they are characterized by a high voltage breakdown and low leakage. Further, since they exhibit large pre-breakdown current stress, they are particularly useful for circuits which utilize double polysilicon structures for EEPROM's. They are also useful for those integrated circuits in which interpolysilicon capacitors are present or in which during use, higher voltages are experienced than are sustainable with silicon dioxide.

In the oxidized nitsinitride structures, the top nitride layer is oxidized to an oxynitride material. The oxidation of the dielectric layer can be continued so as to change silicon remaining between the two nitride layers into silicon dioxide and in this case, breakdown voltage from the order of 7.5 volts to the 9 to 10 volt range. Oxidation may be further continued to convert the lower level nitride partially or wholly into oxynitride and, in fact, oxidation can extend to the top layer of the substrate.

Although the specific embodiments describe the use of a nitrogen ambient, multilayer nitridation may also take place in ammonia or other suitable nitrogen-containing ambients. Indeed the use of ammonia gives a thicker layer than the 4 to 5 nanometer thickness which is the largest single layer thickness that can be obtained with a single nitridation step in nitrogen at 10 atmospheres and 1000 degrees centigrade. As an alternative to nitridation at high pressure, nitridation can be performed in plasma activated ambients. The nitsinitride or oxidized nitsinitride structure can be fabricated in a single vessel enabling rapid processing and minimal contamination.

Wafers may be partially processed prior to incorporation of the nitsinitride or oxidized nitsinitride structure at certain areas thereof. They can be subsequently processed using standard processing steps known in the integrated circuit fabrication art. These steps depend on the particular application of the wafer but for example, include formation of polycrystalline silicon layers, doping of particular regions of the wafer for example by phosphorous in a POCl$_3$ atmosphere, deposition of a dielectric protective layer, deposition of aluminum:silicon alloy for interconnects, and photoengraving to define electrode, contact window and interconnect regions. Finally the structure is sintered in hydrogen at 450 degrees centigrade for 35 minutes after metallization and gold may be deposited as a substrate electrode.

It will be appreciated that nitsinitride and oxidized nitsinitride dielectrics find application beyond the field integrated circuits, for example, in solar cell technology.

What is claimed is:

1. A method of forming a composite nitsinitride dielectric layer comprising in a first nitridation step, thermally growing a first silicon nitride layer on a silicon substrate, depositing a non-single crystal silicon layer on the silicon nitride, and, in a second nitridation step, thermally growing a second silicon nitride layer on the deposited silicon such that said first silicon nitride layer, said non-single crystal silicon layer and said second silicon nitride layer form a nitsinitride dielectric layer.

2. A method as claimed in claim 1 further said nitsinitride layer from an outer surface thereof at least partly through the layer.

3. A method as claimed in claim 1 in which the substrate silicon is monocrystalline.

4. A method as claimed in claim 1 in which the substrate silicon is a layer of one of the group of materials consisting of polycrystalline silicon and amorphous silicon, the layer overlying a supporting substrate.

5. A method as claimed in claim 1 in which the deposited silicon is one of the group consisting of polycrystalline silicon and amorphous silicon.

6. A method as claimed in claim 1 in which the deposited silicon layer is sufficiently thick that following the second nitridation step a nitride-silicon-nitride sandwich structure remains.

7. A method as claimed in claim 1 in which the deposited silicon layer is sufficiently thin that during the second nitridation step the deposited silicon is totally consumed and a relatively thick dual nitride layer remains.

8. A method as claimed in claim 1 in which nitridation takes place in an atmosphere of nitrogen.

9. A method as claimed in claim 8 in which the nitrogen is at a temperature of about 1000 degrees centigrade and a pressure of about 10 atmospheres.

10. A method as claimed in claim 2 in which oxidation is continued so as to oxidize the deposited silicon.

11. A method as claimed in claim 10 in which oxidation is continued so as to oxidize the first nitride layer.

12. A method as claimed in claim 11 in which oxidation is continued so as to oxidize at least part of the substrate silicon.

13. A method as claimed in claim 1 in which each layer of silicon nitride is between 2 and 12 nanometers in thickness.

14. A method as claimed in claim 1 in which silicon deposition and subsequent nitridation are repeated so as to produce a composite dielectric comprising a plurality of nitsinitride layers.

15. A method as claimed in claim 14 further comprising oxidizing at least a part of said nitsinitride layers.

* * * * *